United States Patent [19]

Machida et al.

[11] Patent Number: 5,637,445

[45] Date of Patent: Jun. 10, 1997

[54] BASE FILM HAVING DIMENSIONAL STABILITY AND HIGH TRANSPARENCY AND PHOTOGRAPHIC LIGHT-SENSITIVE MATERIAL COMPRISING SAME

[75] Inventors: Toshinori Machida; Atsushi Hirokawa; Fusao Ito, all of Tokyo, Japan

[73] Assignee: Toyo Ink Manufacturing Co., Ltd., Tokyo, Japan

[21] Appl. No.: 572,149

[22] Filed: Nov. 21, 1995

Related U.S. Application Data

[62] Division of Ser. No. 233,933, Apr. 28, 1994, Pat. No. 5,496,690.

[30] Foreign Application Priority Data

Oct. 29, 1992 [JP] Japan ................................ 5-271378
Apr. 7, 1994 [JP] Japan ................................ 6-69675

[51] Int. Cl.$^6$ ...................................................... G03C 1/76
[52] U.S. Cl. .......................... 430/533; 430/523; 430/939; 430/961
[58] Field of Search ....................... 430/523, 527, 430/530, 533, 939, 961

[56] References Cited

U.S. PATENT DOCUMENTS

| 4,078,935 | 3/1978 | Nakagiri et al. ................ 430/525 |
| 4,269,916 | 5/1981 | Bilofsky et al. ................ 430/523 |
| 5,204,219 | 4/1993 | Van Ooij et al. ................ 430/523 |

*Primary Examiner*—Janet C. Baxter
*Attorney, Agent, or Firm*—Sughrue, Mion, Zinn, Macpeak & Seas

[57] ABSTRACT

A base film having dimensional stability and high transparency, which comprises (A) a plastic film having on either one or both sides thereof (B) a thin film layer comprising (1) an oxide of silicon and (2) a fluoride of alkaline earth metal, or comprising (1) an oxide of silicon, (2) a fluoride of alkaline earth metal, and (3) an oxide of magnesium, the thin film layer (B) being formed by a vacuum film forming process. A photographic light-sensitive material comprising the base film having dimensional stability and high transparency, having on either one or both sides thereof (C) a photographic layer.

13 Claims, No Drawings

BASE FILM HAVING DIMENSIONAL STABILITY AND HIGH TRANSPARENCY AND PHOTOGRAPHIC LIGHT-SENSITIVE MATERIAL COMPRISING SAME

This is a divisional of application Ser. No. 08/233,933, filed Apr. 28, 1994, now U.S. Pat. No. 5,496,690.

FIELD OF THE INVENTION

The present invention relates to a base film having a high dimensional stability which can be advantageously used as a support for an original film for a photomechanical process, an original film for a printed circuit board, etc. More particularly, the present invention relates to a base film further having high transparency, i.e., an excellent light transmission in the near ultraviolet region. The present invention also relates to a photographic light-sensitive material comprising such a base film.

BACKGROUND OF THE INVENTION

As a support for an original film for a photomechanical process, an original film for a printed circuit board (PCB), etc. (hereinafter sometimes simply referred to as a "support"), a polyethylene terephthalate film having a relatively good dimensional stability against the variation of relative humidity (hereinafter sometimes abbreviated as "humidity") or temperature has been used. This is because an original film for a photomechanical process is liable to cause color drift in the lamination of four colors, i.e., cyan, magenta, yellow and black, when the positions of the exposure of the films deviate from each other due to the variation of humidity or temperature. In the case of an original film for a printed circuit board, if image drift occurs due to the variation of humidity or temperature when printed circuit boards obtained by the exposure of these films are laminated on another, drilling for making through-hole may damage the circuit.

A polyethylene terephthalate film exhibits a relatively small dimensional change against the variation of humidity or temperature among high molecular films. Nevertheless, it is inevitably liable to cause some dimensional change. Thus, it is necessary that an original film for a photomechanical process, an original film for a printed circuit board, etc. be used in a special room that is considerably finely controlled to a humidity of about from 55 to 60% RH and a temperature of from 20° to 27° C. all the time and these films be exposed in this working atmosphere for a prolonged period of time, so that they are moisture- and temperature-conditioned. This drastically reduces the working efficiency.

JP-A-5-289236 (the term "JP-A" as used herein means an unexamined published Japanese patent application) proposes a photographic light-sensitive material comprising at least one hydrophilic image pre-colored layer on a support having a barrier layer made of $SiO_x$ (in which x is in the range of from 1.2 to 1.8) provided on a hydrophobic polyester film. In this photographic light-sensitive material, the support having an $SiO_x$ barrier layer exhibits a small dimensional change due to humidity as compared with the hydrophobic polyester film itself as a base material. In the case where such a photographic light-sensitive material is used in the field of PCB, however, the longer the working time is, or the larger the difference is between the working atmosphere (particularly humidity) in which the photographic light-sensitive material is exposed to form an image and the subsequent working atmosphere, the less sufficient is the dimensional stability against humidity. The dimensional change shown in examples in JP-A-5-289236 is too large for practical use. This is mainly attributed to the fact that a barrier layer singly composed of $SiO_x$ (in which x is in the range of 1.2 to 1.8) cannot provide sufficient water vapor barrier properties.

Further, the support having $SiO_x$ as a barrier layer deposited on a hydrophobic polyester film exhibits a low transmission to the light of the near ultraviolet region because $SiO_x$ itself shows a considerably strong brown color. In particular, the smaller x is, the stronger is the brown color resulting in low transmission. Therefore, if such a support laminated with a light-sensitive resin such as resist is exposed to near ultraviolet rays (e.g., 350 nm) and developed in a desired pattern, it suffers from low transmission of light, requiring a higher output light source or a longer exposure time that reduces the productivity of printed circuit board.

SUMMARY OF THE INVENTION

An object of the present invention is to provide a base film that exhibits a high dimensional stability against the variation of humidity and temperature (particularly humidity) and an excellent light transmission to near ultraviolet rays in the vicinity of a wavelength of 350 nm, which can be used in the field of an original film for a photomechanical process, an original film for a printed circuit board, etc.

Another object of the present invention is to provide a photographic light-sensitive material comprising the foregoing base film.

These and other objects of the present invention will become more apparent from the following detailed description and examples.

The present invention relates to a base film having dimensional stability and high transparency, which comprises (A) a plastic film having on either one or both sides thereof (B) a thin film layer comprising (1) an oxide of silicon and (2) a fluoride of alkaline earth metal, the thin film layer (B) being formed by a vacuum film forming process.

The present invention also relates to a base film having dimensional stability and high transparency, which comprises (A) a plastic film having on either one or both sides thereof (B) a thin film layer comprising (1) an oxide of silicon, (2) a fluoride of alkaline earth metal, and (3) an oxide of magnesium, the thin film layer (B) being formed by a vacuum film forming process.

The present invention further relates to a base film having dimensional stability and high transparency, which comprises (A) a plastic film having on either one of both sides thereof (B) a thin film layer comprising a siloxane unit having bonded thereto a fluoride of an alkaline earth metal, the thin film layer (B) being formed by vacuum film forming process.

The present invention further relates to a base film having dimensional stability and high transparency, which comprises (A) a plastic film having on either one or both sides thereof (B) a thin film layer comprising a siloxane unit having bonded thereto a fluoride of an alkaline earth metal and an oxide of magnesium, the thin film layer (B) being formed by vacuum film forming process.

The present invention further relates to a photographic light-sensitive material comprising one of the foregoing base films having dimensional stability, having on either one or both sides thereof (C) a photographic layer.

DETAILED DESCRIPTION OF THE INVENTION

In the present invention, as the plastic film (A), a polyethylene terephthalate film having a relatively high dimensional stability among high molecular films may be preferably used. However, because a plastic film having deposited with the thin film layer (B) made of (1) an oxide of silicon and (2) a fluoride of alkaline earth metal or made of (1) an oxide of silicon, (2) a fluoride of alkaline earth metal, and (3) an oxide of magnesium can provide a high dimensional stability, a plastic film which is somewhat inferior to a polyethylene terephthalate film in dimensional stability can be used in the present invention. For example, plastic films of polyethylene-2,6-naphthalate, cellulose acetate, and polycarbonate can be used.

The plastic film (A) used in the present invention is preferably a heat-fixed film, and particularly preferably a biaxially stretched film.

The surface of the plastic film (A) is preferably provided with nothing. However, the surface of the plastic film (A) may be previously coated with an organic electrically conducting agent such as surface active agent and high molecular electrolyte or inorganic electrically conducting agent such as electrically conductive metal oxide, and an adhesion aid. Further, the plastic film (A) may be provided with an organic barrier layer of polyvinylidene chloride or the like on either one or both sides thereof.

The thickness of the plastic film (A) is not particularly limited and depends on the purpose of the base film but is preferably in the range of from 50 to 500 µm. When it is used as a support for an original film for a photomechanical process, an original film for a printed circuit board, etc., its thickness is preferably in the range of from 75 to 250 µm, and particularly preferably from 100 to 175 µm.

The thin film layer (B) must exhibit a good transmission of light in the range of visible light to near ultraviolet rays for use in the exposure of a light-sensitive layer, high water vapor barrier properties (i.e., low water vapor permeability) for plastic film and little expansion due to heat and moisture, and must strongly adhere to the plastic film (A).

If this thin film layer (B) is composed of $SiO_x$ (in which x is in the range of 1.2 to 1.8) as disclosed in JP-A-5-289236, its water vapor barrier properties are not sufficiently excellent, and its light transmission in the near ultraviolet region is low. In the present invention, a fluoride of alkaline earth metal or both a fluoride of alkaline earth metal and an oxide of magnesium are added to an oxide of silicon (e.g., $SiO_x$) which exhibits a high adhesiveness with a plastic film but exhibits insufficient water vapor barrier properties and a low light transmission in the vicinity of 350 nm in the near ultraviolet region, the thin film layer (B) can be provided that exhibits improvements in the light transmission in the wavelength range from near ultraviolet region to visible light region and the water vapor barrier properties.

Examples of the fluoride of an alkaline earth metal (2) used in the thin film layer (B) include magnesium fluoride, calcium fluoride, strontium fluoride, and barium fluoride. Particularly preferred among these compounds are magnesium fluoride and calcium fluoride.

Examples of the magnesium oxide (3) used in the thin film layer (B) include magnesium oxide, co-oxide of magnesium oxide and silicon dioxide, e.g., forsterite and steatite, and composite of magnesium oxide and a fluoride of an alkaline earth metal.

In the thin film layer (B), the fluoride of an alkaline earth metal is chemically bonded to the silicon oxide, or the fluoride of alkaline earth metal and magnesium oxide are chemically bonded to the silicon oxide. In other words, the thin film layer (B) comprises a compound of silicon oxide and fluoride of alkaline earth metal, or a compound of silicon oxide, fluoride of alkaline earth metal, and magnesium oxide.

The thin film layer made of a compound of silicon oxide and fluoride of alkaline earth metal is excellent both in dimensional stability and light transmission, particularly in light transmission. Similarly, the thin film layer made of a compound of silicon oxide, fluoride of alkaline earth metal, and magnesium oxide is excellent both in dimensional stability and light transmission, particularly in dimensional stability.

The content of the oxide of silicon (1) and the content of the fluoride of an alkaline earth metal (2) constituting the thin film layer (B) are preferably from 80 to 98 mol % and from 2 to 20 mol %, and particularly preferably form 90 to 95 mol % and from 5 to 10 mol %, respectively. When the oxide of magnesium (3) is used in the thin film layer (B), the content of the silicon oxide (1), the content of the fluoride of an alkaline earth metal (2), and the content of the magnesium oxide (3) are preferably from 80 to 97.5 mol %, from 2 to 19.5 mol %, and from 0.5 to 18 mol %, and from 5 to 10 mol %, particularly preferably from 88 to 93 mol %, from 5 to and from 2 to 7 mol %, respectively. All the percents by mol used above are based on the total amount of the thin film layer (B).

In the thin film layer (B) deposited on the plastic film (A), an oxide of silicon may be eventually bonded to a fluoride of an alkaline earth metal or to a fluoride of an alkaline earth metal and an oxide of magnesium after the thin film layer (B) is deposited on the plastic film (A). The starting materials of the thin film layer (B) are therefore not particularly limited and may be inorganic and organic compounds such as metal oxides, fluorides of an alkaline earth metal, metals, and organic metal compounds, and mixtures thereof. In particular, a mixture of an oxide of silicon and a fluoride of an alkaline earth metal, and a mixture of an oxide of silicon, a fluoride of an alkaline earth metal, and a co-oxide of silicon dioxide and magnesium oxide as a starting material are preferably subjected to vacuum deposition or the like methods to form the thin film layer (B) directly on the plastic film (A). The proportions of these components, when a mixture of an oxide of silicon and a fluoride of an alkaline earth metal is used, are preferably in the range of from 70 to 98 mol %, particularly preferably 90 to 95 mol %, for silicon oxide and from 2 to 30 mol %, particularly preferably from 5 to 10 mol %, for fluoride of alkaline earth metal. When a mixture of an oxide of silicon, a fluoride of an alkaline earth metal, and a co-oxide of silicon dioxide and magnesium oxide is used, the proportions of these components are preferably in the range of from 70 to 97.5 mol %, particularly preferably from 90 to 95 mol %, for oxide of silicon, from 2 to 29.5 mol %, particularly preferably from 4.5 to 9.5 mol %, for fluoride of an alkaline earth metal, and from 0.5 to 28 mol %, particularly preferably from 0.5 to 5.5 mol %, for co-oxide of silicon dioxide and magnesium oxide. All the percents by mol used above are based on the total amount of the starting materials.

Examples of the oxide of silicon used as a starting material include a mixture of silicon (Si) and silicon dioxide ($SiO_2$), silicon monoxide (SiO), and a mixture of silicon, silicon dioxide and silicon monoxide. When the starting silicon oxide is a mixture of silicon and silicon dioxide, the composition ratio of silicon and silicon dioxide is preferably a substantially equimolar ratio but the range of from 40/60 to 60/40 by mol can be generally used. When the starting silicon oxide is a mixture of silicon, silicon dioxide and silicon monoxide, the ratio of silicon and silicon dioxide is preferably a substantially equimolar ratio, and the ratio of the total amount of silicon and silicon dioxide to silicon monoxide is not particularly limited.

The vacuum film forming process to provide of the thin film layer (B) on the plastic film (A) may be either a continuous winding process or a batch sheet process. The vacuum film forming process is not specifically limited. For example, a vacuum deposition process, an ion plating process, a sputtering process, a plasma CVD process, a microwave CVD process, etc. may be used. A heating means in the vacuum deposition process is not specifically limited so far as it causes no vapor scattering called "splash" during vacuum deposition or such "splash", if any, is scarce enough to be removed with ease. For example, a known heating means such as high frequency induction heating, resistance heating, and electron beam heating may be used. If there occurs a large amount of vapor scattering, scattered metal deposits are left on the deposited film as foreign matters that will cause many troubles in the subsequent procedures such as an emulsion coating process, an exposure process and a development process. An evaporation source for vacuum deposition may be an ordinary crucible, and a system allowing for invariably uniform vacuum deposition of substances having different sublimation points and melting points, as disclosed in U.S. Pat. No. 5,107,791 and a system capable of continuously supplying and discharging an evaporation material as disclosed in U.S. Pat. No. 5,230,923 are preferably used.

The degree of vacuum, in which the mixture of a silicon oxide and a fluoride of an alkaline earth metal or the mixture of a silicon oxide, a fluoride of an alkaline earth metal and a co-oxide of silicon dioxide and magnesium oxide is evaporated, is preferably in the range of from $1\times10^{-4}$ torr to $5\times10^{-3}$ torr. This range of degree of vacuum can be used in the vacuum evaporation of the foregoing composition to obtain the desired composition of the thin film layer (B).

When the degree of vacuum is relatively high, the composition of the thin film layer (B) may be substantially equal to the composition of the starting material. When the degree of vacuum is relatively low, the composition of the thin film layer (B) becomes high in oxygen content (high oxidized degree) in comparison to the composition of the starting material, because of reactions between evaporated particles and oxygen atoms during vacuum deposition. The density of the thin film layer (B) may be high when the degree of vacuum is relatively high, and may be relatively low when the degree of vacuum is relatively low. By employing the degree of vacuum in the above range and the above composition of the starting materials, the thin film layer (B) having a desired composition can be obtained.

Examples of the process for forming the thin film layer (B) other than the above vacuum deposition include a process which comprises vacuum evaporation of a metal or a metal-containing compound such as organic metal oxide while being oxidized or fluorinated, and a process which comprises forming a fluoride of alkaline earth metal on a plastic film as a deposit, and then oxidizing the deposit. The oxidizing process is not specifically limited so far as it is effected within the working temperature range in which the plastic film can be used. For example, oxygen gas may be introduced during vacuum deposition. Alternatively, a discharge treatment process, an oxygen plasma process, a thermal oxidation process, etc. may be used.

The thin film layer (B) may be formed on one side of the plastic film (A), and particularly preferably on both sides of the plastic film (A).

The thin film layer (B) prepared according to the present invention comprises a siloxane unit having bonded thereto a fluoride of an alkaline earth metal, or a siloxane unit having bonded thereto a fluoride of an alkaline earth metal and an oxide of magnesium.

The siloxane unit which constitutes the thin film layer (B) indicates a unit having a chain of silicon atoms and oxygen atoms (e.g., —O—Si—O—) in the thin film layer. The fluoride of an alkaline earth metal bonded to the siloxane unit indicates a fluoride of an alkaline earth metal bonded to a chain of silicon atoms and oxygen atoms (e.g., —O—Si—O—M—F, M: alkaline earth metal). The fluoride of an alkaline earth metal and an oxide of magnesium bonded to the siloxane unit indicates a fluoride of an alkaline earth metal bonded to a chain of silicon atoms and oxygen atoms (e.g., —O—Si—O—M—F, M: alkaline earth metal) and an oxide of magnesium bonded to a chain of silicon atoms and oxygen atoms (e.g., —O—Si—O—Mg—O—), which are mixed and connected via siloxane units.

The thickness of the thin film layer (B) can be appropriately selected depending on the thickness of the plastic film (A) used. It is preferably in the range of from 50 to 1,000 Å, and particularly preferably from 300 to 600 Å, on one side of the plastic film (A).

The thin film layer (B) to be deposited on the plastic film (A) may be composed of two or more layers so far as it can eventually provide necessary functions. In other words, the vacuum film forming process may be effected in two or more batches. In this case, fluorides of different alkaline earth metals may be used.

The dimensional stability afforded by the thin film layer (B) is considered to be attributed to two major factors. One of the two factors is the effect of moisture-proof layer having water vapor barrier properties. The substance of this effect is described in JP-A-5-289236. By depositing the thin film layer (B) on ether one or both sides of a plastic film as a base film, absorption of water or water vapor, which is one of major causes of dimensional change, by the plastic film can be retarded. The other factor is the effect of physically inhibiting dimensional change afforded by depositing the thin film layer (B) having a low expansion coefficient on either one or both sides of the plastic film. In other words, the plastic film which has absorbed water can be physically protected from dimensional change by a thin film which is insusceptible to dimensional change due to humidity or temperature.

If the factor of the dimensional stability of the plastic film against the variation of humidity were only the water vapor barrier properties of the thin film layer, the plastic film having the thin film layer according to the present invention may suffer from gradual penetration of water content which causes dimensional change in the same amount as would be made in the thin film-free polyester film unless water vapor can be completely prevented from penetrating into the plastic film. In fact, the thin film layer (B) according to the present invention exhibits water vapor barrier properties of about 0.5 g/m$^2$·24 hr at 40° C. and 90% RH and thus cannot completely cut off water content. In other words, the water vapor barrier effect of the thin film layer is merely to retard the progress of dimensional change. The amount of dimensional change of the plastic film comprising a known thin film layer in equilibrium after a prolonged period of time is considered to be the same as that of the plastic film free of the thin film layer. However, the amount of dimensional change of the plastic film comprising the thin film layer (B) according to the present invention in equilibrium does not coincide with that of the plastic film free of the thin film layer in equilibrium. The plastic film having the thin film layer (B) according to the present invention reaches equilibrium at about 75% of the amount of dimensional change of the plastic film free of the thin film layer in equilibrium. It is considered that this means that the remaining 25% of the amount of dimensional change of the plastic film is physically suppressed by the thin film layer.

Further, the physical suppression of dimensional change by the thin film layer is attributed to the fact that the thin film layer forms one continuous molecules as a whole. This is considered to be because that if the thin film layer is an aggregate of free molecules, such a physical suppression of dimensional change by the thin film layer may be hardly possible taking into account the bonding strength of these molecules.

In some detail, a thin film of an oxide of silicon and magnesium fluoride vacuum-deposited on both sides of a polyethylene terephthalate film having a thickness of 100 μm exhibits water vapor barrier properties of about 0.5 g/m²·24 hr at 40° C. and 90% RH. The expansion coefficient of the oxide of silicon is $9 \times 10^{-7}$/K, which is the thermal expansion coefficient of $SiO_2$, a typical oxide of silicon. On the other hand, the polyethylene terephthalate film itself exhibits a thermal expansion coefficient of about $10^{-5}$/K. A compound obtained by bonding a fluoride of alkaline earth metal or a fluoride of alkaline earth metal and magnesium oxide to an oxide of silicon exhibits a lower thermal expansion coefficient than an oxide of silicon (e.g., $SiO_x$) alone. For example, cordierite ($2MgO \cdot 2Al_2O_3 \cdot 5SiO_2$) exhibits a thermal expansion coefficient of $5 \times 10^{-7}$/K, which is smaller than those of MgO ($14 \times 10^{-6}$/K), $Al_2O_3$ ($7 \times 10^{-6}$/K), and $SiO_2$ ($9 \times 10^{-7}$/K). In other words, it is thought that these components are properly complexed with each other to attain the small thermal expansion coefficient. The reduction of thermal expansion coefficient by such complexing is known.

The surface analysis by ESCA (electron spectroscopy for chemical analysis) of a thin film layer obtained as a typical example according to the present invention from an oxide of silicon and magnesium fluoride as starting materials shows that a 2 p orbital of Mg has bond energies of 48.0 eV and 47.1 eV. Among the two bond energies, 48.0 eV corresponds to the peak given by an Mg—F bond, and 47.1 eV corresponds to the peak given by an Mg—O bond in an Si—O—Mg bond (47.1 eV corresponds to the peak given by forsterite ($SiO_2 \cdot 2MgO$)). The peak intensity indicating the bonded amount in Mg—F is almost the same as that indicating the bonded amount in Si—O—Mg. From this fact, it is presumed that Mg—F and Si—O—Mg are bonded to each other to form an Si—O—Mg—F bond. This demonstrates that the composition of the thin film obtained according to the present invention is a complex compound of magnesium fluoride with an oxide of silicon, part of three-dimensional Si—O network of which is Si—O—Mg—F rather than mere Si—O bond. Further, if the oxide of silicon were not bonded to magnesium fluoride, this 47.1 eV peak will not be detected.

The reason why the bonding of a fluoride of an alkaline earth metal or a fluoride of alkaline earth metal and an oxide of magnesium to an oxide of silicon provides a considerable improvement in the water vapor barrier properties as compared with an oxide of silicon alone can be thought as follows: A film composed of an oxide of silicon alone is made of $SiO_x$ (in which x is in the range of 1.2 to 1.8) which is not in a fully oxidized state ($SiO_2$). In other words, the amount of oxygen atoms are insufficient for silicon atoms, enabling the permeation of water ($H_2O$) via unpaired electrons of silicon atom. For example, it can be thought that the bonding of —Mg—F to these unpaired electrons of silicon atom reduces the number of unpaired electrons of silicon atom, resulting in improved water vapor barrier properties.

The reason why the bonding of a fluoride of an alkaline earth metal to an oxide of silicon provides an improvement in the light transmission in the near ultraviolet regions compared with an oxide of silicon alone can be thought as follows: An oxide of silicon and a fluoride of an alkaline earth metal assume transparent depending on the wavelength of light. SiO assumes transparent in the wavelength range of 500 nm to 8 μm. In other words, SiO assumes opaque at 350 nm. On the other hand, a fluoride of an alkaline earth metal assumes transparent in a wider wavelength range. For example, magnesium fluoride assumes transparent in the wavelength range of 210 nm to 10 μm. It is thus presumed that the use of an oxide of silicon having a fluoride of an alkaline earth metal bonded thereto as the thin film layer (B) provides an improvement in the light transmission in the near ultraviolet region.

The photographic light-sensitive material according to the present invention comprises a photographic layer (C) laminated on either one or both sides of the foregoing base film according to the present invention as a support.

Though not specifically limited, the photographic layer (C) generally is one mainly composed of a gelatin-containing silver halide photographic emulsion. Examples of such a silver halide include silver chloride, silver bromochloride, silver bromoiodide, and silver bromochloroiodide. Various additives which can be incorporated in the photographic emulsion, such as a chemical sensitizer, a fog inhibitor, a surface active agent, a protective colloid, a hardener, a polymer latex, a color coupler, a matting agent, and a sensitizing dye, are not specifically limited. For example, those disclosed in *Research Disclosure*, vol. 176, pp. 22 to 28, December 1978, which is incorporated herein by reference, can be used. In particular, those containing a silane compound as disclosed in claim 6 in JP-A-5-289236 are preferred.

The process for the preparation of the photographic emulsion and the process for the coating of such a photographic emulsion on a dry plating layer provided on a plastic film are not specifically limited. For example, those disclosed in the above cited Research Disclosure can be used.

For the process for the application of the photographic layer (C) to the thin film layer (B), a known process can be used. A subbing layer for improving the adhesiveness may be provided between the thin film layer (B) and the photographic layer (C).

In the photographic light-sensitive material according to the present invention, an electrically conductive layer (D) may be provided on one side of the base film in addition to the photographic layer (C) provided on either one or both sides of the base film. If the photographic layer (C) has been provided on one side of the base film, the electrically conductive layer (D) is generally provided on the side of the base film (A) opposite the photographic layer (C).

The electrically conductive layer (D) may be made of an inorganic compound such as an electrically conductive metal oxide alone, a mixture of an electrically conductive metal oxide and an insulating metal oxide and a metal alone, or an organic compound such as a surface active agent and a high molecular electrolyte, but the electrically conductive layer (D) is not specifically limited. If a metal alone is used as an electrically conductive layer (D), it exhibits a low light transmission in the range of from visible light to near infrared rays. Therefore, the metal must be applied to the support as thin as possible so far as a predetermined desired electrical conductivity can be obtained to improve the light transmission in the range of from visible light to near ultraviolet rays, which is used in the exposure of the photographic layer.

As the process for forming the electrically conductive layer (D) comprising an electrically conductive metal oxide alone, a mixture of an electrically conductive metal oxide and an insulating metal oxide, or an electrically conductive metal alone on the plastic film (A), the foregoing process for providing the thin film layer (B) on the plastic film (A) can be used.

Examples of the electrically conductive metal oxide include ITO (indium-tin oxide), an oxide of indium, and an oxide of tin. Examples of the insulating metal oxide include an oxide of silicon, and an oxide of aluminum. Examples of the electrically conductive metal include ordinary metals such as aluminum and nickel. The surface active agent and high molecular electrolyte are not specifically limited. Known surface active agents and high molecular electrolytes can be used. As the process for providing the electrically conductive layer (D) comprising these components on the support, any known process can be employed.

The thin film layer (B) and the electrically conductive layer (D) may be separately provided on the plastic film (A) as a support. In the case of the continuous winding process, the two layers may be simultaneously provided on the respective sides of the support.

In the present invention, the plastic film (A), the thin film layer (B), the photographic layer (C) and the electrically conductive layer (D) may be constructed to form a layer structure C/B/A/B/D, thereby providing a photographic light-sensitive material which exhibits a high dimensional stability against the variation of humidity or temperature and an excellent light transmission in the near ultraviolet region necessary for exposing the photographic layer and does not suffer from adverse effects of static charge. The layer structure may be altered to C/B/A/B/D/B, C/B/A/B or the like.

If necessary, a surface protective layer may be provided outside the photographic layer (C). Further, a subbing adhesion aid layer or an antihalation layer may be provided outside or between the photographic layer (C), the thin film layer (B), the plastic film (A), and the electrically conductive layer (D). A surface protective layer may be provided outside the layers of the photographic light-sensitive material. These functional layers may be provided singly or in combination by an ordinary method.

The present invention will be further described by referring to the following Examples and Comparative Examples, but the present invention should not be construed as being limited thereto.

The properties in the Examples and Comparative Examples were evaluated by the following manner:
(1) Light Transmission The light transmission in the near ultraviolet region was measured at a wavelength of 350 nm with air as a reference by means of a spectrophotometer (U-best 30 available from Nippon Bunkosha Co.). 350 nm is a commonly used wavelength at which an ordinary printed circuit board is exposed to light through an original film.
(2) Dimensional Stability The length change due to the variation of humidity and temperature was determined by measuring the dimensional change of the specimen due to the variation of humidity and temperature by means of a length meter (DR-8011-CU available from Dainippon Screen Mfg. Co., Ltd.). The specimen was put in a transparent constant humidity and temperature bath which can be humidity-controlled. This constant humidity and temperature bath was provided on the specimen plate of the length meter. The small the dimensional change is, the better is the dimensional stability. In the field of printed circuit board, an original film having a high dimensional stability against humidity change is desired.
(3) Composition Analysis of Thin Film Layer ESCA PHI-5400 available from Perkin Elmer Corp. was used for the composition analysis of the thin film layer. The surface of the specimen was vacuumized and argon-sputtered before measurement. The carbon peaks produced by the contamination of trace amounts of organic substances were omitted from the calculation of the composition of the thin film layer. The composition obtained by ESCA analysis is expressed in terms of atom % which agrees with the composition in terms of mol %.

EXAMPLE 1

A 46/46/8 (by mol %) mixture of silicon, silicon dioxide, and magnesium fluoride as a starting material (evaporation source) was vacuum-deposited under heating on both sides of a biaxially-oriented polyethylene terephthalate film (O type, available from Teijin Ltd.) having a thickness of 100 µm to a thickness of about 600 Å on each side by means of a vacuum deposition apparatus of the continuous winding and resistance heating type as disclosed in U.S. Pat. Nos. 5,107,791 and 5,230,923 capable of continuously feeding and discharging an evaporation source.

EXAMPLE 2

The same vacuum deposition apparatus and polyethylene terephthalate film as used in Example 1 were used. A 49/49/2 (by mol %) mixture of silicon, silicon dioxide and calcium fluoride as a starting material was vacuum-deposited under heating on both sides of the polyethylene terephthalate film to a thickness of about 600 Å on each side.

EXAMPLE 3

The same vacuum deposition apparatus and polyethylene terephthalate film as used in Example 1 were used. A 80/20 (by mol %) mixture of silicon monoxide and magnesium fluoride as a starting material was vacuum-deposited under heating on both sides of the polyethylene terephthalate film to a thickness of about 200 Å on each side.

EXAMPLE 4

The same vacuum deposition apparatus and polyethylene terephthalate film as used in Example 1 were used. A 90/7/3 (by mol %) mixture of silicon monoxide, magnesium fluoride, and a co-oxide of an oxide of silicon and an oxide of magnesium (forsterite: $SiO_2 \cdot 2MgO$) as a starting material was vacuum-deposited under heating on both sides of the polyethylene terephthalate film to a thickness of about 800 Å on each side.

EXAMPLE 5

The system for heating the evaporation source in the vacuum deposition apparatus used in Example 1 was changed from resistance heating to electron beam heating. The same polyethylene terephthalate film as used in Example 1 was used. A 49/49/2 (by mol %) mixture of silicon, silicon dioxide and strontium fluoride as a starting material was vacuum-deposited under heating on both sides of the polyethylene terephthalate film to a thickness of about 600 Å on each side.

EXAMPLE 6

The same vacuum deposition apparatus and polyethylene terephthalate film as used in Example 5 were used. A 80/20 (by mol %) mixture of silicon monoxide and barium fluoride as a starting material was vacuum-deposited under heating on both sides of the polyethylene terephthalate film to a thickness of about 600 Å on each side.

COMPARATIVE EXAMPLE 1

The polyethylene terephthalate film used in Example 1 was measured for light transmission and dimensional stability. The results are set forth in Table 1.

COMPARATIVE EXAMPLE 2

The same vacuum deposition apparatus and polyethylene terephthalate film as used in Example 1 were used. A 50/50 (by mol %) mixture of silicon and silicon dioxide as a starting material was vacuum-deposited under heating on both sides of the polyethylene terephthalate film to a thickness of about 600 Å on each side.

COMPARATIVE EXAMPLE 3

The same vacuum deposition apparatus and polyethylene terephthalate film as used in Example 1 were used. A 90/10 (by mol %) mixture of silicon monoxide, and a co-oxide of an oxide of silicon and an oxide of magnesium (forsterite: $SiO_2 \cdot 2MgO$) as a starting material was vacuum-deposited under heating on both sides of the polyethylene terephthalate film to a thickness of about 600 Å on each side.

COMPARATIVE EXAMPLE 4

The same vacuum deposition apparatus and polyethylene terephthalate film as used in Example 1 were used. A 46/46/8 (by mol %) mixture of silicon, silicon dioxide and sodium fluoride as a starting material was vacuum-deposited under heating on both sides of the polyethylene terephthalate film to a thickness of about 600 Å on each side.

The deposited films (base films) obtained in Examples 1 to 6 and Comparative Examples 2 to 4 were then measured for the composition of deposited film on both sides thereof, light transmission, and dimensional stability. The results are set forth in Table 1.

TABLE 1

| | Composition of deposited thin film[1] (atom %) | | | | Light transmission (T %) | Dimensional change[2] ($\mu m/m \cdot$ % RH) |
|---|---|---|---|---|---|---|
| Example 1 | Si 31.4 | O 59.2 | Mg 3.4 | F 6.0 | 81 | 1.1 |
| Example 2 | Si 34.8 | O 62.6 | Ca 1.0 | F 1.6 | 81 | 1.3 |
| Example 3 | Si 28.6 | O 50.7 | Mg 7.1 | F 13.6 | 80 | 1.5 |
| Example 4 | Si 31.1 | O 58.4 | Mg 5.0 | F 5.5 | 82 | 1.0 |
| Example 5 | Si 34.7 | O 62.4 | Sr 1.2 | F 1.7 | 80 | 1.5 |
| Example 6 | Si 29.5 | O 53.2 | Ba 6.1 | F 11.2 | 80 | 1.5 |
| Comparative Example 1 | Not detected | | | | 76 | 8 |
| Comparative Example 2 | Si 37.3 | O 62.7 | | | 63 | 3.8 |
| Comparative Example 3 | Si 32.0 | O 60.8 | Mg 7.2 | | 69 | 1.8 |
| Comparative Example 4 | Si 31.1 | O 57.4 | Na 5.5 | F 6.0 | 80 | 7 |

Note:
[1] Results of composition analysis of deposited thin film by ESCA
[2] Dimensional change with 1% humidity change

EXAMPLES 7 TO 12

ITO (indium-tin oxide; 5 wt % of Sn added) was vacuum-deposited under heating on one of the two deposited surfaces of each of the base films obtained in Examples 1 to 6 with oxygen gas being introduced by means of the same vacuum deposition apparatus as used in Examples 1 to 4 (to a thickness of about 500 Å. The oxygen partial pressure was $2 \times 10^{-4}$ torr. An ordinary photographic silver halide gelatin layer containing 6 wt % of an epoxy silane compound No. 4 as described in U.S. Pat. No. 3,661,584 (2nd column) was coated on the side of the base film opposite ITO-deposited surface by means of a bar coater to a dry weight of 4 g/m². The resulting photographic light-sensitive materials were then measured for dimensional stability in the same manner as mentioned above. The results are set forth in Table 2.

COMPARATIVE EXAMPLES 5 TO 8

ITO (indium-tin oxide; 5 wt % of Sn added) was vacuum-deposited under heating on one of the two deposited surfaces of each of the base films obtained in Comparative Examples 1 to 4 with oxygen gas being introduced by means of the same vacuum deposition apparatus as used in Examples 1 to 4 (to a thickness of about 500 Å). The oxygen partial pressure was $2 \times 10^{-4}$ torr. An ordinary photographic silver halide gelatin layer containing 6 wt % of an epoxy silane compound No. 4 as described in U.S. Pat. No. 3,661,584 (2nd column) was coated on the side of the base film opposite ITO-deposited surface by means of a bar coater to a dry weight of 4 g/m². The resulting photographic light-sensitive materials were then measured for dimensional stability in the same manner as mentioned above. The results are set forth in Table 2.

TABLE 2

| | Dimensional change with 1% humidity change (gm/m · % RH) |
|---|---|
| Example 7 | 3.0 |
| Example 8 | 3.2 |
| Example 9 | 3.3 |
| Example 10 | 3.0 |
| Example 11 | 3.3 |
| Example 12 | 3.3 |
| Comparative Example 5 | 11 |
| Comparative Example 6 | 6.2 |
| Comparative Example 7 | 3.8 |
| Comparative Example 8 | 10.5 |

As mentioned above, the base film according to the present invention and the photographic light-sensitive material comprising the base film exhibit an excellent dimensional stability against the variation of humidity and temperature, particularly humidity, and an excellent light transmission in the near ultraviolet region. Further, the generation of static charge of the base film of the present invention can be suppressed by providing an electrically conductive layer to cause no troubles due to the contamination by foreign matters during the coating or exposure of the photographic layer.

While the invention has been described in detail and with reference to specific embodiments thereof, it will be apparent to one skilled in the art that various changes and modifications can be made therein without departing from the spirit and scope thereof.

What is claimed is:

1. A photographic light-sensitive material comprising a base film having dimensional stability and high transparency, having on either one or both side thereof (C) a photographic layer, said base film comprising (A) a plastic film having on either one or both side thereof (B) a thin film layer comprising (1) an oxide of silicon and (2) a fluoride of alkaline earth metal, said thin film layer (B) being formed by a vacuum film forming process, wherein the content of said oxide of silicon (1) is from 80 to 98 mol %, and the content of said fluoride of alkaline earth metal (2) is from 2 to 20 mol %, both based on the total amount of said thin film layer (B).

2. A photographic light-sensitive material as claimed in claim 1, which comprises said base film having dimensional stability, having on either one or both sides thereof said photographic layer (C), and further having on one side thereof (D) an electrically conductive layer.

3. A photographic light-sensitive material as claimed in claim 1, wherein the thickness of said thin film layer (B) is from 50 to 1,000 Angstroms.

4. A photographic light-sensitive material as claimed in claim 3, wherein the thickness of said plastic film (A) is from 50 to 500 μm.

5. A photographic light-sensitive material as claimed in claim 4, wherein the thickness of said thin film layer (B) is from 300 to 600 Angstroms.

6. A photographic light-sensitive material as claimed in claim 1, wherein said plastic film (A) has on both sides thereof said thin film layer (B).

7. A photographic light-sensitive material comprising a base film having dimensional stability and high transparency, having on either one or both sides thereof (C) a photographic layer, said base film comprising (A) a plastic film having on either one or both sides thereof (B) a thin film layer comprising (1) an oxide of silicon, (2) a fluoride of alkaline earth metal, and (3) an oxide of magnesium, said thin film layer (B) being formed by a vacuum film forming process.

8. A photographic light-sensitive material as claimed in claim 7, which comprises said base film having dimensional stability, having on either one or both sides thereof said photographic layer (C), and further having on one side thereof (D) an electrically conductive layer.

9. A photographic light-sensitive material as claimed in claim 7, wherein said plastic film (A) has on both sides thereof said thin film layer (B).

10. A photographic light-sensitive material comprising a base film having dimensional stability and high transparency, having on either one or both sides thereof (C) a photographic layer said base film comprising (A) a plastic film having on either one of both sides thereof (B) a thin film layer comprising a siloxane unit having bonded thereto a fluoride of an alkaline earth metal, said thin film layer (B) being formed by vacuum film forming process.

11. A photographic light-sensitive material as claimed in claim 10, wherein said plastic film (A) has on both sides thereof said thin film layer (B).

12. A photographic light-sensitive material comprising a base film having dimensional stability and high transparency, having on either one or both side thereof (C) a photographic layer said base film comprising (A) a plastic film having on either one or both sides thereof (B) a thin film layer comprising a siloxane unit having bonded thereto a fluoride of an alkaline earth metal and an oxide of magnesium, said thin film layer (B) being formed by vacuum film forming process.

13. A photographic light-sensitive material as claimed in claim 12, wherein said plastic film (A) has on both sides thereof said thin film layer (B).

* * * * *

UNITED STATES PATENT AND TRADEMARK OFFICE
CERTIFICATE OF CORRRECTION

PATENT NO. : 5,637,445  
DATED : June 10, 1997  
INVENTOR(S) : Toshinori Machida, et al.

Page 1 of 2

It is certified that error appears in the above-identified patent and that said Letters Patent is hereby corrected as shown below:

On the title page, in item [56] References Cited, insert the following:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 4 | 7 | 0 | 2 | 9 | 6 | 3 | 10/1987 | Phillips et al | | | |
| | | 5 | 0 | 8 | 5 | 9 | 0 | 4 | 2/1992 | Deak et al | | | |
| | | 4 | 2 | 3 | 5 | 0 | 4 | 8 | 11/1980 | Gillery | | | |
| | | 3 | 9 | 1 | 4 | 5 | 2 | 2 | 10/1975 | Saverin et al | | | |
| | | 3 | 8 | 7 | 4 | 8 | 7 | 9 | 4/1975 | Rasch | | | |
| | | 3 | 8 | 6 | 4 | 1 | 3 | 2 | 2/4/75 | Rasch et al | | | |
| | | 4 | 0 | 4 | 8 | 3 | 5 | 7 | 9/13/77 | Van Paesschen et al | | | |
| | | 5 | 2 | 8 | 1 | 5 | 1 | 4 | 1/25/94 | Desie et al | | | |
| | | | | | | | | | | | | | |

UNITED STATES PATENT AND TRADEMARK OFFICE
CERTIFICATE OF CORRRECTION

PATENT NO. : 5,637,445
DATED : June 10, 1997
INVENTOR(S) : Toshinori Machida, et al.

It is certified that error appears in the above-identified patent and that said Letters Patent is hereby corrected as shown below:

On the title page, in item [56] References Cited, insert the following:

FOREIGN PATENT DOCUMENTS

|   |   | DOCUMENT NUMBER |   |   |   |   | PUBLICATION DATE | COUNTRY OR PATENT OFFICE | CLASS | SUBCLASS | TRANSLATION YES | NO |
|---|---|---|---|---|---|---|---|---|---|---|---|---|
|   | 1 | 0 | 6 | 6 | 9 | 4 | 4 | 4/1967 | Britain |   |   |   |   |
|   | 2 | 2 | 1 | 9 | 4 | 4 | 0 | 9/2/77 | France |   |   |   |   |
|   | 5 | 2 | 3 | 9 | 6 | 2 | 2 | 9/17/93 | Japan |   |   |   |   |

Signed and Sealed this

Thirteenth Day of April, 1999

Attest:

Q. TODD DICKINSON

*Attesting Officer*   Acting Commissioner of Patents and Trademarks